Figure 1:
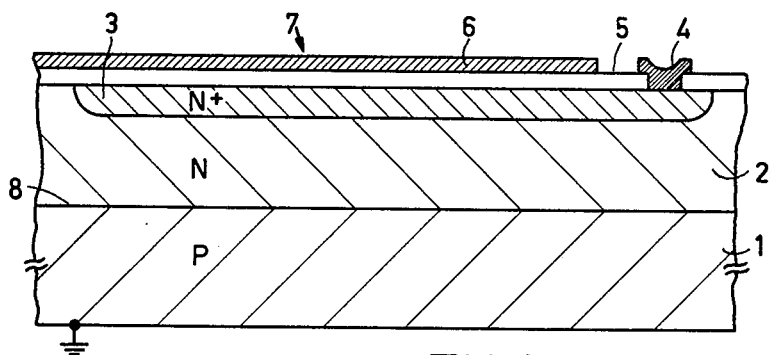

United States Patent [19]
Goerth

[11] 4,214,252
[45] Jul. 22, 1980

[54] SEMICONDUCTOR DEVICE HAVING A MOS-CAPACITOR

[75] Inventor: Joachim Goerth, Lüneburg, Fed. Rep. of Germany

[73] Assignee: U.S. Philips Corporation, New York, N.Y.

[21] Appl. No.: 929,442

[22] Filed: Jul. 31, 1978

[30] Foreign Application Priority Data

Aug. 6, 1977 [DE] Fed. Rep. of Germany ....... 2735529
Jun. 15, 1978 [DE] Fed. Rep. of Germany ....... 2826192

[51] Int. Cl.² ............................................. H01G 29/78
[52] U.S. Cl. ........................................ 357/23; 357/14; 357/37; 307/304; 307/303; 307/320
[58] Field of Search ............................ 357/23, 14, 37; 307/304, 320, 303

[56] References Cited

U.S. PATENT DOCUMENTS

3,893,146  7/1975  Heeren ................................... 357/14
3,953,875  4/1976  Cave ....................................... 357/51

*Primary Examiner*—Martin H. Edlow
*Attorney, Agent, or Firm*—Thomas A. Briody; Jack Oisher; Paul R. Miller

[57] ABSTRACT

A semiconductor element having a MOS-capacitor between a zone provided in an epitaxial layer on a substrate and a conductive layer on an insulating layer above the zone.

The stray capacitance between the zone and the substrate of the opposite conductivity type is considerably reduced in that the zone in the semiconductor body is surrounded by a further zone of the opposite conductivity type. The further zone may be applied to a fixed potential via a connection electrode.

7 Claims, 6 Drawing Figures

SEMICONDUCTOR DEVICE HAVING A MOS-CAPACITOR

The invention relates to a semiconductor device comprising a semiconductor body having a semiconductor substrate of a first conductivity type and a semiconductor layer of the second conductivity type situated thereon and covered with an insulating layer, in which a MOS-capacitor is formed between a conductive layer situated on the insulating layer and a highly doped zone of the second conductivity type adjoining the surface of the semiconductor layer and provided in the semiconductor layer.

Such a semiconductor element may form an integrated circuit in which other circuit elements are provided which cooperate with the MOS-capacitor or several corresponding MOS-capacitors in a circuit.

An example of such an integrated circuit is an oscillator circuit in which the MOS-capacitor operates as a phase shifting capacitor.

A semiconductor device of the kind mentioned in the preamble is known, for example, from "Scientia Electronica" X (1964), 4, pp. 97–122, in particular p. 118, FIG. 28.

However, the MOS-capacitor formed therein has as a load impedance the large stray capacitance which is formed by the barrier layer capacitance between the semiconductor substrate of the first conductivity type and the semiconductor layer of the second conductivity type which is preferably provided epitaxially thereon.

The use of such MOS-capacitors is restricted by the large stray capacitance with respect to the substrate.

It is the object of the present invention to provide a semiconductor device of the kind mentioned in the preamble in which the stray capacitance between the MOS-capacitor and the semiconductor substrate is considerably reduced without expensive extra measures.

According to the invention this is achieved in that a further zone of the first conductivity type which entirely surrounds the zone of the second conductivity type is present between the highly doped zone of the second conductivity type and the remaining part of the semiconductor layer.

The advantages resulting from the invention consist mainly in that the substrate capacitance, due to its being split up in series-arranged sub-capacitances, is considerably reduced so that the MOS-capacitor can be used more universally.

When the further zone and/or the semiconductor layer are provided with a connection electrode, it is possible to apply to the further zone of the first conductivity type, as well as to the semiconductor layer of the second conductivity type, external electrical potentials in such manner as to be sure that first of all the barrier layers formed by the device are biased in the reverse direction so that parasitic effects, if any, are avoided with certainty and that secondly by a suitable choice of the electric potentials the sub-capacitances can be maintained small due to their voltage dependence so that the overall stray capacitance formed by the series-arrangement of the sub-capacitances can become very small with respect to the semiconductor substrate.

The invention furthermore relates to a circuit arrangement in which the barrier layer capacitances loading the MOS-capacitor are further reduced or in part are made entirely inoperative. For that purpose, according to a further preferred embodiment, the barrier layer capacitance between the highly doped zone and the further zone is connected parallel to the emitter-base junction of an emitter-follower transistor.

The advantages resulting from the invention consist particularly in that the largest one of the barrier layer capacitances loading the MOS-capacitor, namely the capacitance between the highly doped zone of the second conductivity type and the further zone of the first conductivity type, is made entirely inoperative because the emitter and the base of the emitter follower transistor with which said capacitance is connected in parallel, always pass an alternating voltage of the same phase and value.

Figure 2:
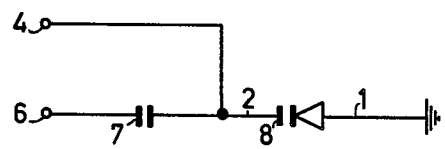
Figure 3:
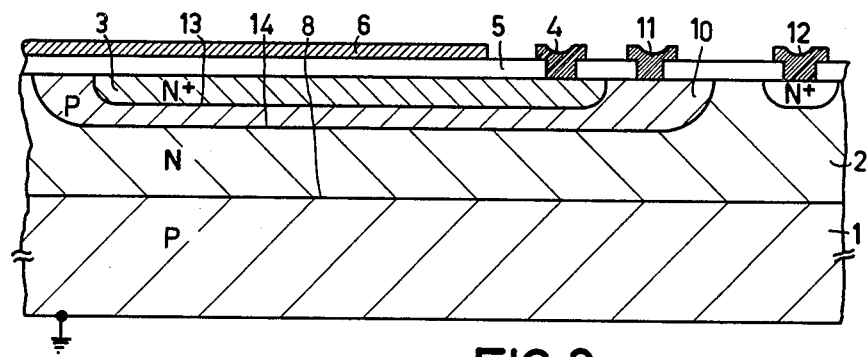

The invention will now be described in greater detail with reference to the accompanying drawings, in which FIG. 1 is a sectional view of a semiconductor device having a prior art MOS-capacitor, FIG. 2 shows the equivalent circuit diagram of the MOS-capacitor shown in FIG. 1, FIG. 3 is a sectional view of a semiconductor device having a MOS-capacitor according to the invention.

Figure 4:
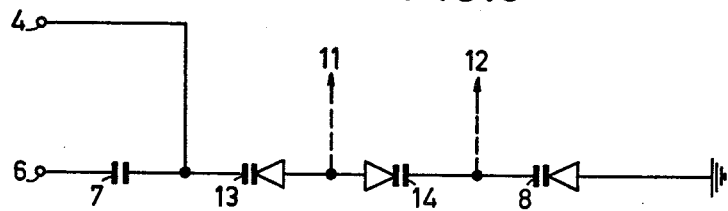
Figure 5:
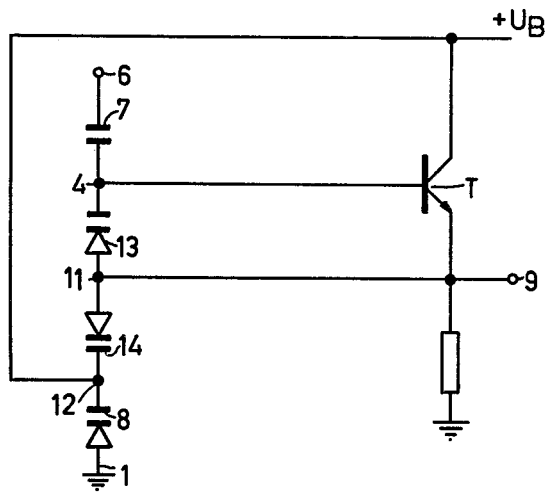
Figure 6:
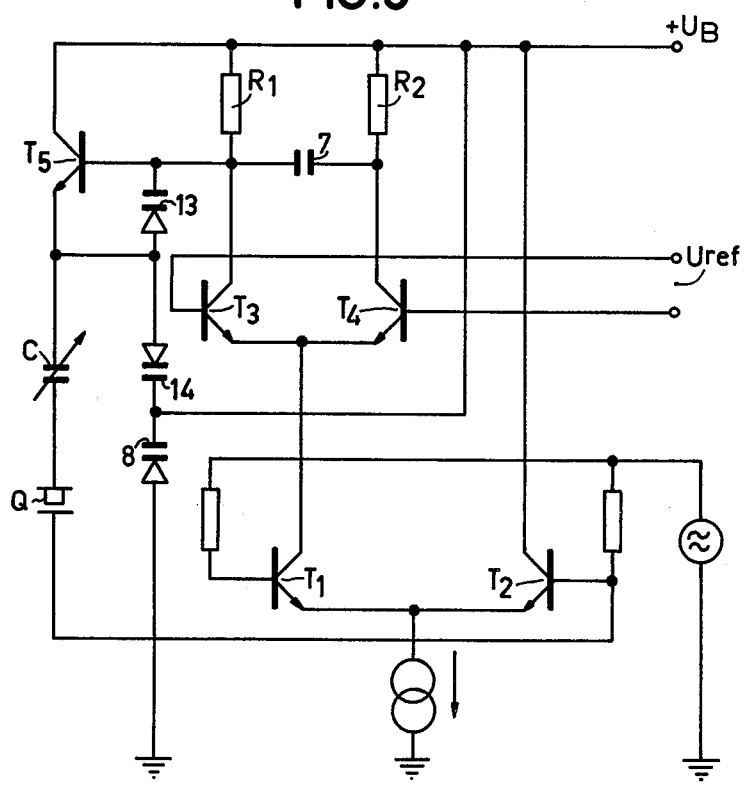

FIG. 4 shows the equivalent circuit diagram of the MOS-capacitor shown in FIG. 3, FIG. 5 shows the device according to the invention in a circuit, and FIG. 6 shows a semiconductor device having an oscillator circuit according to the invention.

In the figures, corresponding parts are generally referred to by the same reference numerals. The figures are diagrammatic and not drawn to scale. In the cross-sectional views, semiconductor regions of the same conductivity type are shaded in the same direction. Furthermore, the p-n junctions and the barrier layer capacitances corresponding therewith are referred to by the same reference numerals.

FIG. 1 is a cross-sectional view of a known semiconductor device having a MOS-capacitor. The part shown comprising the MOS-capacitor consists of a p-type silicon substrate 1 which in particular in the direction of its thickness is not drawn to scale and on which an n-type epitaxial layer 2 is provided. An n+-type zone 3 adjoining the surface of the semiconductor body is diffused into said layer 2. The zone 3 has a contact electrode 4. The surface of the semiconductor body is covered with an insulating layer 5, for example a silicon oxide layer. A conductive electrode 6 which together with the zone 3 and the insulating layer 5 constitutes the MOS-capacitor 7 is provided on the layer 5.

FIG. 2 shows the equivalent circuit diagram of the MOS-capacitor shown in FIG. 1. Beside the MOS-capacitor 7 between the electrode 6 and the contact electrode 4 a barrier layer capacitance 8 is formed in the semiconductor body between the p-type substrate 1 and the n-type epitaxial layer 2. The barrier layer capacitance 8, also referred to as substrate capacitance, is connected on one side, at the connection 4, to the MOS-capacitor 7 as a result of which several disadvantages arise.

A voltage introduced at the connection 6 is no longer fully transmitted to the connection 4 because the device forms a capacitive potentiometer between the connection 6 and the substrate, the output of which is formed by the connection 4.

When the MOS-capacitor is used in symmetrical electrical circuits, such as they are often used for example, as differential amplifiers in integrated semiconductor circuits, the symmetry is disturbed by the unilaterally operating substrate capacitance (for example in symmetrical filters).

When the MOS-capacitor is used as a phase shifting capacitance in tunable quartz oscillator circuits, the phase characteristic is considerably distorted by the substrate capacitance.

FIG. 3 shows a semiconductor device embodying the invention, in which the substrate capacitance is considerably reduced. Corresponding parts in this semiconductor element are referred to by the same reference numerals as in the semiconductor element shown in FIG. 1.

In the semiconductor device embodying the invention a diffused further zone 10 of the p-type adjoining the zone 3 and surrounding same is provided between the highly doped surface-adjacent n+-type zone 3 and the remaining part of the epitaxial layer 2. The zone 10 has a contact electrode 11. Due to the presence of the p-type zone 10, two p-n junctions 13 and 14 and hence corresponding barrier layer capacitances are formed between the n+-type zone 3 and the epitaxial layer 2, which, as is shown in the equivalent circuit diagram shown in FIG. 4, are arranged in series with the MOS-capacitor 7 and the barrier layer capacitance 8 between the epitaxial layer 2 and the substrate 1.

The substrate capacitance which acts as a load for the MOS-capacitor 7 therefore now consists of the series-arranged barrier layer capacitances 8, 13 and 14 and hence is considerably smaller than the substrate capacitance 8 in the known semiconductor device shown in FIG. 1.

In addition to the further p-type zone 10 the epitaxial layer 2 may also be provided with a contact electrode 12. It is then possible to apply such voltages to the zone 10 and to the layer 2 by means of the contact electrodes that the barrier layers of the capacitances 8 and 14 are always reverse biased.

Various application examples of such a semiconductor element having a MOS-capacitor are feasible, in particular in integrated circuits, in which the operation of the circuit is adversely influenced by the parasitic barrier layer capacitances 13, 14 and 8 which, although reduced, are still present and act as loads for the MOS-capacitor 7.

Of these stray capacitances the barrier layer capacitance 13 between the n+-type zone 3 and the p-type zone 10 is specifically larger.

When the semiconductor device is operated in a circuit arrangement as shown in FIG. 5, the disturbing barrier layer capacitance 13 can be made fully inoperative. For that purpose, the capacitance is connected parallel to the emitter-base junction of an emitter follower transistor T the base-emitter voltage $U_{BE}$ of which blocks the p-n junction which forms the barrier layer capacitance 13. Since alternating voltages of substantially the same phase and the same value are applied to the base and the emitter of the emitter follower transistor, the barrier layer capacitance 13 in this circuit is fully inoperative.

Furthermore, the series arrangement of the barrier layer capacitances 14 and 8 is connected to the emitter of the emitter follower transistor and hence to a circuit point having a very low internal resistance and consequently gives rise only to a small time constant. Because furthermore the connection point between the barrier layer capacitances 8 and 14 is connected vai the connection 12 to the maximum occurring voltage, namely the operating voltage $U_B$, of the circuit, the overall capacitance shows the lowest possible value. The MOS-capacitor 7 available between the connections 6 and 9 thus is free to a considerable extent from influence of stray capacitances.

FIg. 6 shown an oscillator (Rennick-oscillator) suitable in particular for integrated circuits and tunable within certain limits, which oscillator consists of a differential amplifier formed by the transistors T1 and T2, of a potentiometer formed by the transistors T3 and T4 and adjustable by a capacitor voltage $U_{ref}$, and of a phase shifting element formed by resistors R1 and R2 and a MOS-capacitor 7. A feedback branch which comprises in series an emitter follower transistor T5, a quartz oscillator Q and a capacitor C for the fine adjustment of the frequency is connected between the phase shifting element and one input of the differential amplifier T1, T2.

The operation of such an oscillator constructed in integrated technology normally is disturbed still rather considerably in that the MOS-capacitor 7 is loaded by the stray capacitances 13, 14 and 8.

However, this load is reduced and in part made fully inoperative in that a stray capacitance 13 is connected parallel to the emitter follower transistor T5 in the manner described with reference to FIG. 3 and the connection between the barrier layer capacitances 14 and 8 is set up at the maximum occurring voltage, that is at the operating voltage $U_B$.

Due to this manner of providing the barrier layer capacitances 13, 14 and 8 loading the MOS-capacitor 7, it is possible to eliminate substantially entirely the effects thereof on the desired signal.

The invention is not restricted to the embodiments described. For exampoe, instead of silicon any other semiconductor material may be used. The conductivity types used in the examples may also be replaced by their opposite types. Furthermore, silicon nitride or another insulating material may also be used as an insulating layer instead of silicon oxide. The conductive layers described may be manufactured, instead of from a metal, from another readily conducting material, for example, doped polycrystalline silicon.

What is claimed is:

1. A semiconductor device comprising a semiconductor substrate of first conductivity type; a semiconductor layer of second conductivity type overlying said semiconductor substrate; an insulating layer on said semiconductor layer; a conductive layer formed on said insulating layer; a highly doped zone of said second conductivity type formed in the surface of said semiconductor layer; said highly doped zone, said insulating layer, and said conductive layer forming a MOS-capacitor; a further zone of said first conductivity type entirely surrounding said highly doped zone and interposed between said highly doped zone and said semiconductor layer; and a separate connection electrode at each of said highly doped zone, said further zone, and said semiconductor layer.

2. A semiconductor device according to claim 1, wherein the barrier capacitance between said semiconductor substrate and semiconductor layer is always reversed biased to the barrier capacitance between said highly doped zone and further zone.

3. A semiconductor device according to claim 1, wherein the barrier layer capacitance between said highly doped zone and said further zone is connected in parallel to an emitter follower transistor.

4. A semiconductor device according to claim 3, wherein high voltage is applied to said semiconductor layer so that a p-n junction between said semiconductor layer and said semiconductor substrate is reverse biased.

5. A semiconductor device comprising a semiconductor substrate of first conductivity type; a semiconductor layer of second conductivity type overlying said semiconductor substrate; an insulating layer on said semiconductor layer; a conductive layer formed on said insulating layer; a highly doped zone of said second conductivity type formed in the surface of said semiconductor layer; said highly doped zone, said insulating layer, and said conductive layer forming a MOS-capacitor; and a further zone of said first conductivity type entirely surrounding said highly doped zone and interposed between said highly doped zone and said semiconductor layer, wherein the barrier layer capacitance between said highly doped zone and said further zone is connected in parallel to an emitter follower transistor, and wherein said device forms a monolithic integrated circuit with said emitter follower transistor.

6. A semiconductor device according to claim 5, wherein voltage applied to said semiconductor layer is a maximum voltage occurring in said integrated circuit.

7. A semiconductor device according to claim 5, wherein high voltage is applied to said semiconductor layer so that a p-n junction between said semiconductor layer and said semiconductor substrate is reverse biased.

* * * * *